(12) United States Patent
Jang

(10) Patent No.: US 7,871,829 B2
(45) Date of Patent: Jan. 18, 2011

(54) METAL WIRING OF SEMICONDUCTOR DEVICE AND METHOD OF FABRICATING THE SAME

(75) Inventor: Hyung-Soon Jang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 341 days.

(21) Appl. No.: 11/619,111

(22) Filed: Jan. 2, 2007

(65) Prior Publication Data

US 2007/0158845 A1 Jul. 12, 2007

(30) Foreign Application Priority Data

Jan. 2, 2006 (KR) .................. 10-2006-0000223

(51) Int. Cl.
*H01L 21/00* (2006.01)
(52) U.S. Cl. ................. 438/8; 438/9; 438/13; 438/427; 257/734; 257/751
(58) Field of Classification Search ................ 257/751, 257/E21.057, 231, 246, 734; 438/700, 703, 438/761, 778, 750, 659, 43, 3, 8, 9, 13
See application file for complete search history.

(56) References Cited

U.S. PATENT DOCUMENTS

| 5,753,525 | A  | * | 5/1998 | Hsu et al. ................... 438/261 |
| 5,981,379 | A  |   | 11/1999 | Tsai |
| 6,265,315 | B1 |   | 7/2001 | Lee et al. |
| 6,380,071 | B1 |   | 4/2002 | Onuma |
| 6,703,308 | B1 | * | 3/2004 | Besser et al. ................ 438/659 |
| 6,734,559 | B1 | * | 5/2004 | Yang et al. ................... 257/751 |
| 6,753,260 | B1 | * | 6/2004 | Li et al. ....................... 438/700 |
| 7,217,663 | B2 | * | 5/2007 | Huang et al. ................. 438/700 |

(Continued)

FOREIGN PATENT DOCUMENTS

JP 10-199971 7/1998

(Continued)

OTHER PUBLICATIONS

S Wolf et al. Silicon Processing for VLSI Era, vol. 1 Process Technology, First Edition (1986).*

(Continued)

*Primary Examiner*—Matthew E Warren
*Assistant Examiner*—Fang-Xing Jiang
(74) *Attorney, Agent, or Firm*—Myers Bigel Sibley & Sajovec, PA

(57) ABSTRACT

A metal wiring forming method in a semiconductor device can include forming an interlayer insulating film on a lower metal wiring, the first interlayer insulating film having a non-planar upper surface; forming a stop layer on the interlayer insulating film and over the lower metal wiring; forming an interlayer insulating film pattern on the stop layer, wherein an upper surface of the interlayer insulating film pattern and an upper surface of the stop layer are substantially coplanar; removing a portion of the stop layer to form a stop layer pattern, wherein a portion of the interlayer insulating film over the lower metal wiring is exposed by the stop layer pattern; and etching the exposed portion of the interlayer insulating film to form a via hole therethrough, wherein the lower metal wiring is exposed by the via hole.

22 Claims, 6 Drawing Sheets

U.S. PATENT DOCUMENTS

2003/0170919 A1* 9/2003 Song et al. .................. 438/3

FOREIGN PATENT DOCUMENTS

| KR | 1997-0052309 | 7/1997 |
|---|---|---|
| KR | 1999-0027918 | 4/1999 |
| KR | 2000-0008122 | 2/2000 |
| KR | 2003-0002773 | 1/2003 |
| KR | 2003-0058523 | 7/2003 |

OTHER PUBLICATIONS

S Wolf et al. Silicon Processing for VLSI Era, vol. I Process Technology, Second Edition (2000).*
S Wolf, Silicon Processing for VLSI Era, vol. II Process Integration, Edition (1990).*
English language abstract of Japanese Publication No. 10-199971.
English language abstract of Korean Publication No. 2000-0008122.

* cited by examiner

METAL WIRING OF SEMICONDUCTOR DEVICE AND METHOD OF FABRICATING THE SAME

CROSS-REFERENCE TO RELATED APPLICATIONS

This application claims the benefit of foreign priority to Korean Patent Application No. 2006-223, filed on Jan. 2, 2006, the entire contents of which are hereby incorporated by reference.

BACKGROUND

1. Technical Field

Embodiments exemplarily described herein relate generally to semiconductor devices and more particularly to a metal wiring of a semiconductor device and a method for fabricating the same.

2. Description of the Related Art

Highly integrated semiconductor devices are becoming more miniaturized and lighter in weight. As a result, the design rule of semiconductor devices is becoming more reduced. As the design rule is reduced, a width of a metal wiring is also narrowed and it becomes complicated to form via contacts for connecting lower wirings and upper wirings.

Semiconductor devices are fabricated by stacking and patterning a plurality of films or layers on a semiconductor substrate. Above all, an alignment between films or layers is a critical factor. An overlap margin between a lower wiring and an upper wiring, which are electrically interconnected to each other, may be sufficiently considered when a contact hole pattern is disposed to electrically connect films or layers of a semiconductor device.

It can be desirable to secure a maximum overlap margin at a layout in order to perform a stable process. With current trends, however, the contact hole overlap margin becomes minimized due to the high integration of semiconductor devices. In particular, some products or processes have been made or executed without the overlap margin.

FIGS. 1A to 1C are cross-sectional views illustrating a metal wiring fabricating method of a semiconductor device according to the prior art.

Referring to FIG. 1A, a lower interlayer insulating layer 14 with a metal pattern 12 is formed on a semiconductor substrate 10, and an upper interlayer insulating layer 16 is formed on the lower interlayer insulating layer 14. Lower metal wirings 20 are formed on given regions of the upper interlayer insulating layer 16. An interlayer insulating film 22 is formed to cover the lower metal wirings 20. The interlayer insulating film 22 is flattened by use of a well-known chemical mechanical polishing manner.

Referring to FIG. 1B, a photoresist pattern 28 is formed on the flattened interlayer insulating film 22 so as to expose the interlayer insulating film 22 on the lower metal wirings 20. In order to expose upper surfaces of the lower metal wirings 20, via holes 30 are formed by etching the exposed interlayer insulating film 22 using the photoresist pattern 28 as a mask.

Referring to FIG. 1C, after removing the photoresist pattern 28, via contacts 35 are formed to fill the via holes 30, and upper metal wirings 40 are respectively formed on the via contacts 35 so as to be connected electrically to the lower metal wirings 20.

FIG. 2 is a cross-sectional view illustrating a problem of a metal wiring of a semiconductor device according to the prior art.

Referring to FIG. 2, in a case where a metal wiring of a semiconductor device is formed using processes described in FIGS. 1A to 1C, misalignment can occur when forming the via holes 30. This misalignment makes the interlayer insulating film 22 at edges of the lower metal wirings 20 be etched during an etching process for forming the via holes 30. Accordingly, the upper metal wirings 40 are electrically interconnected with a region that must be insulated (i.e., metal pattern 12) as well as with the lower metal wirings 20.

In the case that a metal wiring of a semiconductor device is formed in the above-described manner without the overlap margin, such misalignment can occur during a via hole forming process for connecting the lower metal wirings 20 and the upper metal wirings 40. For this reason, via holes may be formed on upper surfaces of the lower metal wirings 20 and at edges thereof. The upper interlayer insulating layer 16 below the lower metal wirings 20 is simultaneously etched when etching the interlayer insulating film 22 to form via holes. As a result, an electrical interconnection between a lower metal wiring and a metal pattern which is to be insulated and is undesirably formed below the lower metal wiring.

SUMMARY

One embodiment exemplarily described herein can be characterized as a metal wiring forming method that includes: forming an interlayer insulating film on a lower metal wiring, the first interlayer insulating film having a non-planar upper surface; forming a stop layer on the interlayer insulating Film and over the lower metal wiring; forming an interlayer insulating film pattern on the stop layer, wherein an upper surface of the interlayer insulating film pattern and an upper surface of the stop layer are substantially coplanar; removing a portion of the stop layer to form a stop layer pattern, wherein a portion of the interlayer insulating film over the lower metal wiring is exposed by the stop layer pattern; and etching the exposed portion of the interlayer insulating film to form a via hole therethrough, wherein the lower metal wiring is exposed by the via hole.

Another embodiment exemplarily described herein can be characterized as a semiconductor device that includes: a lower metal wiring over a semiconductor substrate; an interlayer insulating film over the lower metal wiring and covering a sidewall of the lower metal wiring, the first interlayer insulating film having a via hole defined therein and exposing the lower metal wiring; a via contact within the via hole and connected to the lower metal wiring; a stop layer pattern on the first interlayer insulating film; an interlayer insulating film pattern on the stop layer pattern, wherein an upper surface of the interlayer insulating film pattern and an upper surface of the stop layer are substantially coplanar; and an upper metal wiring on the via contact.

Yet another embodiment exemplarily described herein can be characterized as a semiconductor device that includes: a substrate; a lower metal wiring on a surface of the substrate; an interlayer insulating film on the surface of the substrate and covering a sidewall of the lower metal wiring, the first interlayer insulating film having a via hole defined therein and exposing the lower metal wiring; a stop layer pattern on the first interlayer insulating film; an interlayer insulating film pattern on the stop layer pattern; a via contact within the via hole and connected to the lower metal wiring; and an upper metal wiring connected to the via contact, wherein the upper metal wiring contacts the stop layer pattern and the interlayer insulating film pattern.

DETAILED DESCRIPTION

Figure 1A:
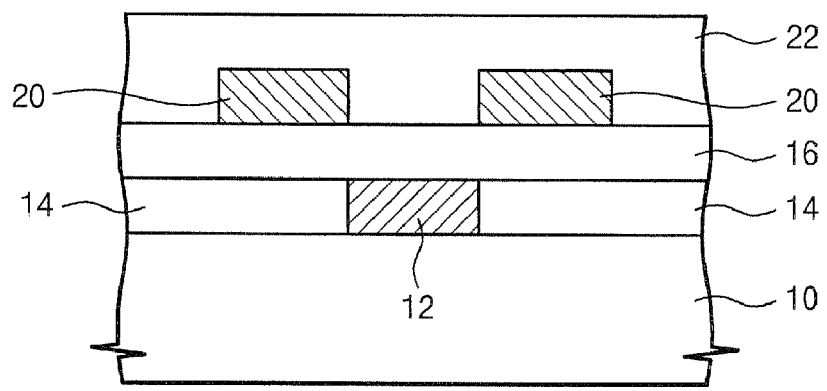
FIGS. 1A to 1C are cross-sectional views illustrating a metal wiring forming method of a semiconductor device according to the prior art.
Figure 1B:
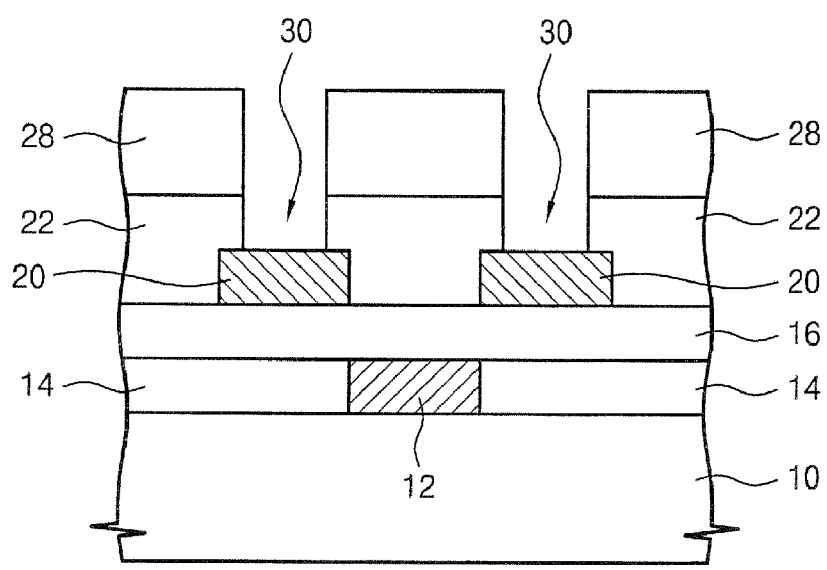
Figure 1C:
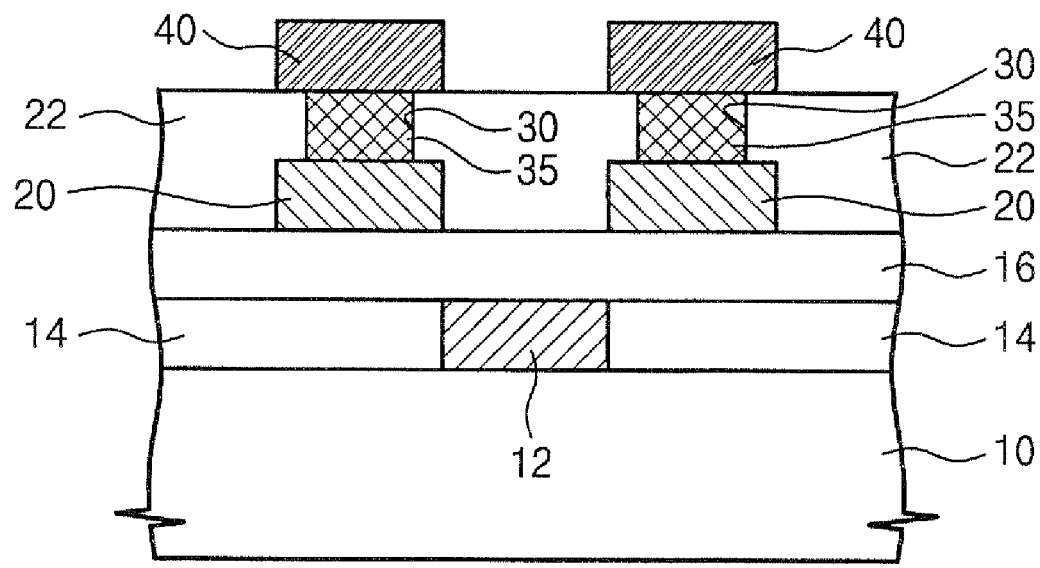
Figure 2:
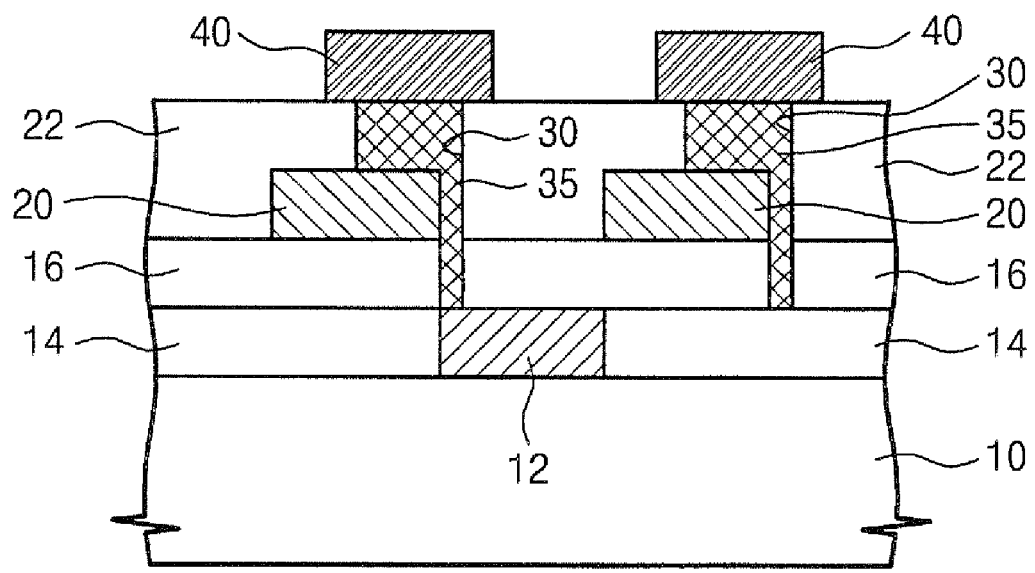
FIG. 2 is a cross-sectional views illustrating a problem of a metal wiring of a semiconductor device according to the prior art.

Exemplary embodiments of the present invention will now be described more fully hereinafter with reference to the accompanying drawings. The embodiments described herein, however, may be realized in many different forms and should not be construed as being limited by the particular description provided below. Rather, these embodiments are provided so that this disclosure will be thorough and complete, and will fully convey the scope of the claimed invention to those skilled in the art. In the drawings, like numbers refer to like elements throughout.

FIGS. 3A to 3E are cross-sectional views illustrating an exemplary method of forming a metal wiring in a semiconductor device according to one embodiment.

Figure 3A:
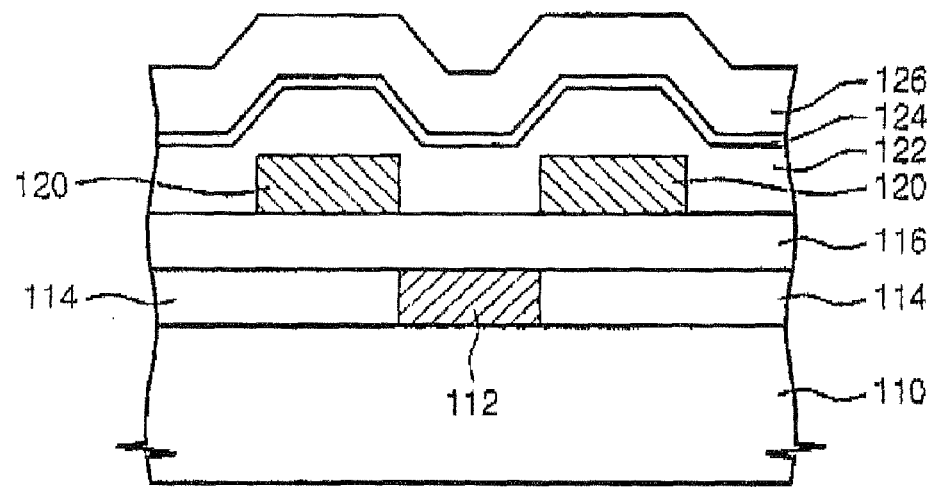
FIGS. 3A to 3E are cross-sectional views illustrating an exemplary method of forming a metal wiring in a semiconductor device according to one embodiment.

Referring to FIG. 3A, a lower interlayer insulating layer 114 with a metal pattern 112 is formed on a semiconductor substrate 110, and an upper interlayer insulating layer 116 is formed on the lower interlayer insulating layer 114. Lower metal wirings 120 are formed on given regions of the upper interlayer insulating layer 116. In one embodiment, the lower metal wirings 120 may be formed by depositing a material such as aluminum (e.g., using a process such as sputtering) and patterning the deposited material. The lower metal wirings 120 may have a thickness of about 3000 Å to 6000 Å.

A first interlayer insulating film 122 is formed over the semiconductor substrate 110 where the lower metal wirings 120 are formed. As illustrated in FIG. 3A, the first interlayer insulating film 122 can be deposited to have a substantially constant thickness based on a profile of the lower metal wirings 120 (i.e., a profile of the first interlayer insulating film 122 corresponds to a profile of the semiconductor substrate 110 where the lower metal wirings 120 are formed). In one embodiment, the first interlayer insulating film 122 may include a material such as silicon oxide deposited using a high density plasma chemical vapor deposition (HDP-CVD) process. The first interlayer insulating layer 122 may be thicker than the lower metal wirings 120 by about by 1000 Å to 2000 Å. That is, the first interlayer insulating layer 122 may have a thickness of about 4000 Å to 7000 Å. The HDP-CVD process is used because the first interlayer insulating film 122 of a shape similar to the profile of the lower metal wirings 120.

A stop layer 124 is formed on the first interlayer insulating layer 122. The stop layer 124 may include a material such as SiN, SiON, or the like, and can be formed using a CVD process. In one embodiment, the stop layer 124 has an etching selectivity with respect to the first interlayer film 122 and a subsequently formed second interlayer insulating film 126. In another embodiment, the stop layer 124 has a dry etching selectivity with respect to the first interlayer insulating layer 122 and a CMP selectivity to the second interlayer insulating film 126. The etching selectivity over 10:1 is preferable, and the stop layer 124 may be formed to have a thickness of about 500 Å to 800 Å.

The second interlayer insulating film 126 is formed on the stop layer 124 and may include a material such as silicon oxide deposited and can be formed using an HDP-CVD or plasma enhanced CVD (PE-CVD) process. The second interlayer insulating film 126 may have a thickness of about 6000 Å to 12000 Å. Unlike the first interlayer insulating film 122, the second interlayer insulating film 126 may be a leveled film (i.e., a film having a substantially planar upper surface) covering an uppermost part of the stop layer 124 regardless of the profile of a lower structure.

Figure 3B:
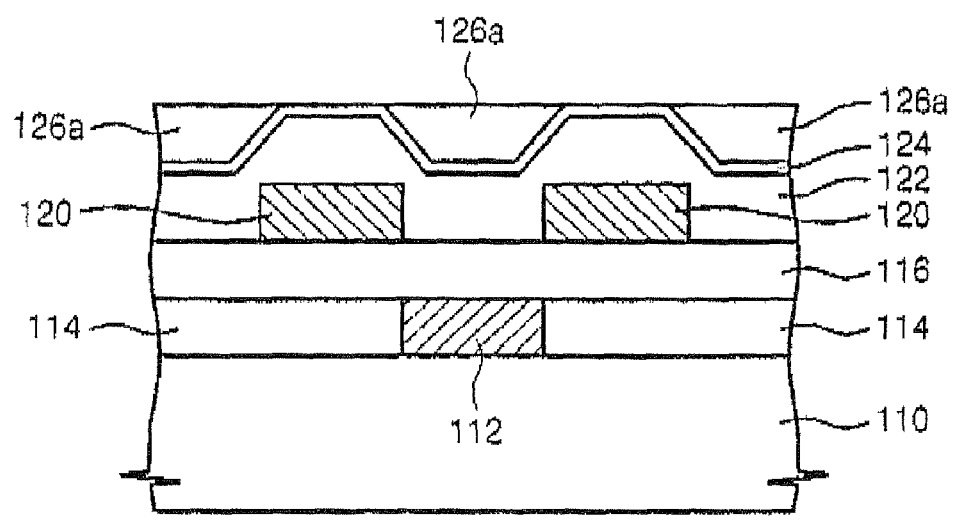

Referring to FIG. 3B, an entire surface of the second interlayer insulating film 126 is etched to expose the stop layer 124 over the lower metal wirings 120, thereby forming second interlayer insulating film patterns 126a (also referred to herein as "interlayer insulating film patterns"). In one embodiment, the second interlayer insulating film 126 may be etched by a process such as CMP.

The prior art necessitates complicated process conditions in order to lower a thickness distribution of a semiconductor wafer during CMP processes. On the other hand, process conditions exemplarily described with respect to FIGS. 3A-3E may be simplified because the stop layer 124 acts as an end point of the CMP process described with respect to FIG. 3B.

In a case of the prior art, a thickness distribution of a semiconductor wafer increases in correspondence with an increased diameter of the semiconductor wafer. On the other hand, the thickness and its distribution of the semiconductor wafer can be reduced by using the stop layer 124 as shown in FIG. 3B. Thus, it is possible to reduce a time which is needed for an etching process for forming the following via hole (referring to FIG. 3D, 130), and an aspect ratio of the via hole. With the reduction of the aspect ratio, it is possible to eliminate or reduce the formation of voids when via contacts are subsequently formed (referring to FIG. 3E, 135). Thus, the reliability of the metal wiring of the semiconductor device can be improved.

Figure 3C:
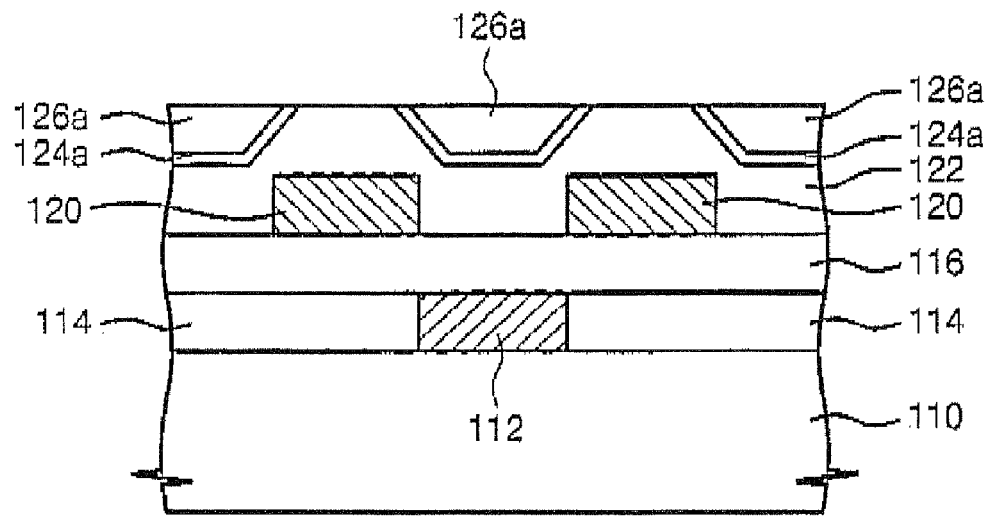

Referring to FIG. 3C, stop layer patterns 124a are formed by removing the exposed stop layer 124 using, for example, a wet etching process that uses an etching solution of $H_3PO_4$ or a mixed solution of $NH_4F$ and HF. The stop layer patterns 124a spaced apart by a size of a via contact (referring to FIG. 3E, 135) that will be formed afterwards. A cross section of the stop layer patterns 124a may have a concave shape. Second interlayer insulating film patterns 126a may remain on the stop layer patterns 124a having the concave cross section, respectively. As shown in FIG. 3C, the upper surface of the second interlayer insulating film patterns 126a may be substantially coplanar with the upper surface of the stop layer pattern 124a, given the relative etching selectivity between the stop layer 124 and the second interlayer insulating film pattern 126a.

Figure 3D:
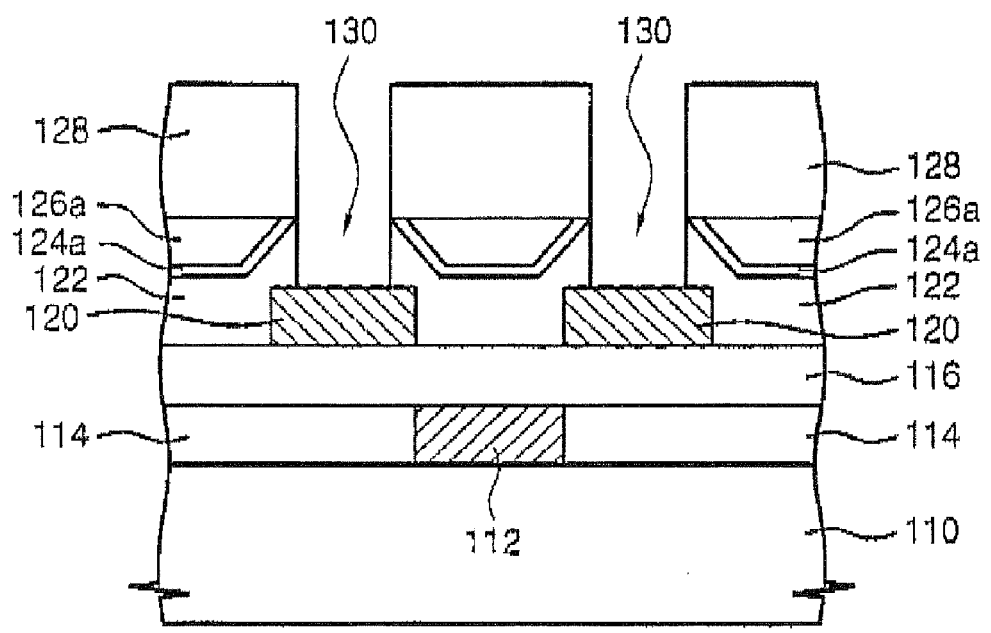

Referring to FIG. 3D, a photoresist pattern 128 is formed over the semiconductor substrate 110, on which the exposed stop layer 124 is removed, so as to expose the first interlayer insulating film 122 on the lower metal wirings 120.

Via holes 130 for exposing upper sides of the lower metal wirings 120 are formed by removing the first interlayer insulating layer 122 thus exposed. A process for etching the first interlayer insulating film 122 may use, for example, an anisotropic dry etching process that uses $CF_4$ as an etching gas.

In a case of the prior art, since a thickness distribution of a semiconductor wafer is increased in proportion to increase in a diameter of the semiconductor wafer, it could be difficult to etch the via holes 130. In other words, if the thickness distribution of the semiconductor wafer is large, damages such as no interconnection may occur due to poor etching in case of using the minimum etching process conditions considering interconnection with the lower metal wirings 120. In addition, damages such as crown may occur when the upper surfaces of the lower metal wirings 120 are etched due to over-etching in case of using the maximum etching process conditions considering interconnection with the lower metal wirings 120.

On the other hand, use of the stop layer 124 as shown in FIGS. 3A-3E permits a reduction in the thickness distribution of the semiconductor wafer as well as a reduction in the occurrence of the above-described damages (i.e., no interconnection between the lower metal wiring and the via hole and etching of the upper surfaces of the lower metal wirings).

Figure 3E:
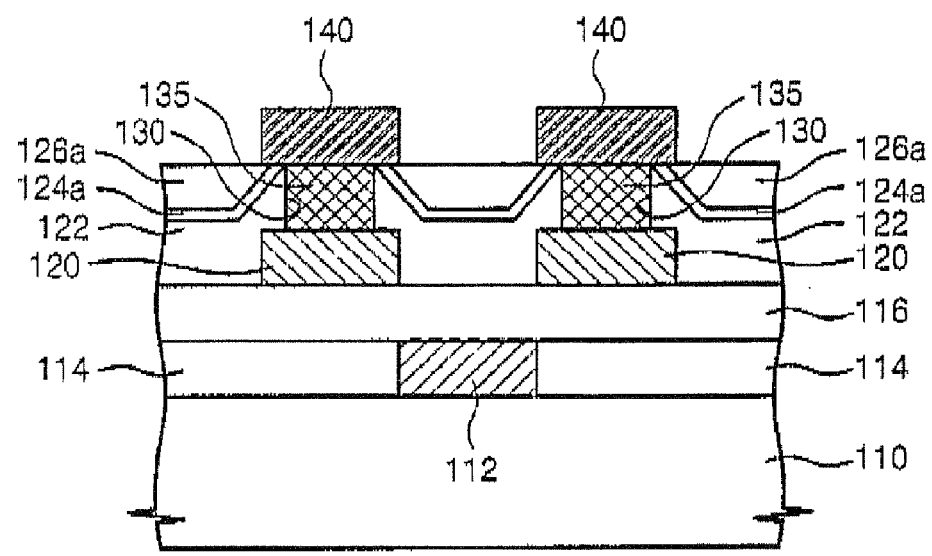

Referring to FIG. 3E, after removing the photoresist pattern 128, via contacts 135 are formed to fill the via holes 130. A metal wiring of a semiconductor device can be formed by forming upper metal wirings 140 on the via contacts 135. The via contacts 135 can include a material such as tungsten deposited using a CVD process. The upper metal wirings 140 can include a material such as aluminum deposited using a sputtering process.

Figure 4:
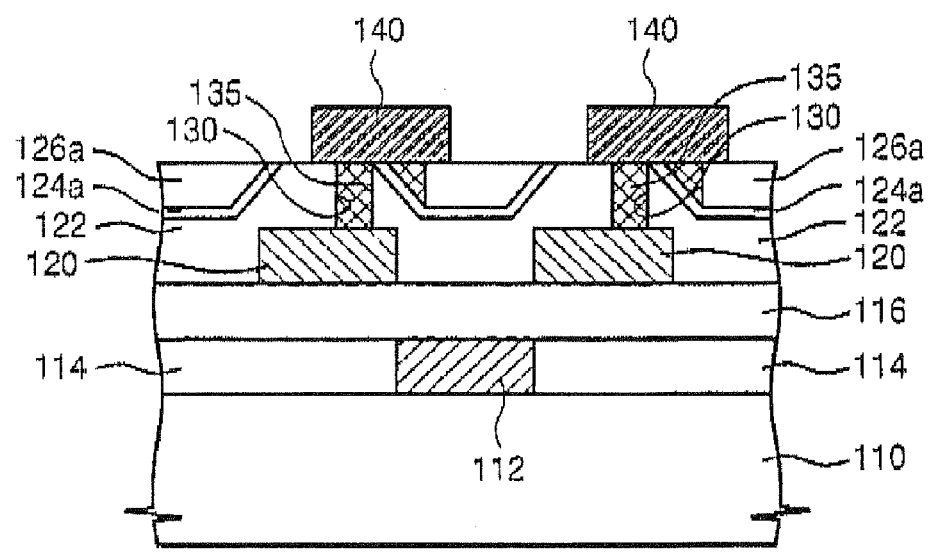
FIG. 4 is a cross-sectional view illustrating a metal wiring in a semiconductor device according to one embodiment.

FIG. 4 is a cross-sectional view illustrating a metal wiring in a semiconductor device according to one embodiment.

Referring to FIG. 4, if, during the formation of a metal wiring using methods described with reference to FIGS. 3A to 3E, misalignment occurs during the etching process for forming the via holes 130, the stop layer patterns 124a prevent the first interlayer insulating film 122 from being etched at regions other than over the lower metal wirings 120. Thus, it is possible to ensure that electrical interconnections are only made with the lower metal wirings 120.

With the metal wiring forming method exemplarily described above, it is possible to prevent electrical interconnection with a region to be insulated except the lower metal wirings 120 even if the misalignment should occur during a process for connecting the metal wiring.

Further, with the metal wiring forming method exemplarily described above, although the misalignment may occur during a via hole formation process for connecting the lower metal wirings and the upper metal wirings without the overlap margin, one side of the respective via holes is aligned by the stop layer pattern, thus stably connecting with the lower metal wirings. As a result, a stable operation of a semiconductor device can be achieved.

Although embodiments of the present invention have been exemplarily described in connection with the accompanying drawings, they are not limited thereto. It will be apparent to those skilled in the art that various substitutions, modifications and changes may be made thereto without departing from the scope and spirit of the claimed invention.

What is claimed is:

1. A metal wiring forming method, comprising:
   forming a first interlayer insulating film on a lower metal wiring, the first interlayer insulating film having a non-planar upper surface;
   forming a stop layer on the first interlayer insulating film and over the lower metal wiring, wherein an upper surface of the stop layer includes a first portion and a second portion higher than the first portion;
   forming an interlayer insulating film pattern on the first portion of the upper surface of the stop layer, wherein an upper surface of the interlayer insulating film pattern is substantially coplanar with the second portion of the upper surface of the stop layer beside the interlayer insulating film pattern;
   removing the second portion of the stop layer and a portion of the first interlayer insulating film to form a via hole exposing the lower metal wiring; and
   forming a via contact filling the via hole such that an upper surface of the via contact is coplanar with a tip of the first portion of the upper surface of the stop layer and the upper surface of the interlayer insulating film pattern.

2. The metal wiring forming method of claim 1, wherein the lower metal wiring comprises aluminum.

3. The metal wiring forming method of claim 1, wherein the first interlayer insulating film and the interlayer insulating film pattern comprise silicon oxide.

4. The metal wiring forming method of claim 3, wherein forming the first interlayer insulating film comprises forming the first interlayer insulating film using a high density plasma chemical vapor deposition process.

5. The metal wiring forming method of claim 1, wherein the stop layer comprises a material having an etching selectivity with respect to the first interlayer insulating film and the interlayer insulating film pattern.

6. The metal wiring forming method of claim 5, wherein the stop layer comprises SiN or SiON.

7. The metal wiring forming method of claim 1, wherein forming the interlayer insulating film pattern comprises:
   depositing an oxide film on the stop layer; and
   etching the oxide film.

8. The metal wiring forming method of claim 7, wherein etching the oxide film comprises etching the surface of the oxide film until the upper surface of the second portion of the stop layer is exposed.

9. The metal wiring forming method of claim 1, wherein removing the second portion of the stop layer comprises etching the stop layer using a wet etching process with $H_3PO_4$ or a mixed solution of $NH_4F$ and $HF$ as an etching solution.

10. The metal wiring forming method of claim 1, wherein removing the portion of the first interlayer insulating film comprises etching the first interlayer insulating film using an anisotropic dry etching process with $CF_4$ as an etching gas.

11. The metal wiring forming method of claim 1, wherein removing the portion of the first interlayer insulating film further comprises etching the first interlayer insulating film to form the via hole using a stop layer pattern as a mask.

12. The metal wiring forming method of claim 1, further comprising:
   forming an upper metal wiring on the via contact.

13. The metal wiring forming method of claim 12, wherein the via contact comprises tungsten.

14. The metal wiring forming method of claim 12, wherein the upper metal wiring comprises aluminum.

15. The metal wiring forming method of claim 1, wherein removing the second portion of the stop layer is performed after the interlayer insulating film pattern is formed.

16. The metal wiring forming method of claim 1, wherein removing the portion of the first interlayer insulating film is performed after the interlayer insulating film pattern is formed.

17. The metal wiring forming method of claim 1, wherein at least a portion of the first portion of the stop layer vertically overlaps the lower metal wiring.

18. The metal wiring forming method of claim 1, further comprising forming a metal pattern below the lower metal wiring, and a lower insulating layer between the metal pattern and the lower metal wiring, wherein at least a portion of the first portion of the stop layer vertically overlaps the metal pattern.

19. A metal wiring forming method, comprising:
forming an interlayer insulating film on a lower metal wiring, the interlayer insulating film having a non-planar upper surface;
forming a stop layer on the interlayer insulating film and over the lower metal wiring;
forming an interlayer insulating film pattern on the stop layer, wherein an upper surface of the interlayer insulating film pattern and an upper surface of the stop layer are substantially coplanar;
removing a portion of the stop layer to form a stop layer pattern, wherein a portion of the interlayer insulating film over the lower metal wiring is exposed by the stop layer pattern;
etching the exposed portion of the interlayer insulating film to form a via hole therethrough, wherein the lower metal wiring is exposed by the via hole; and
forming a via contact filling the via hole such that an upper surface of the via contact is coplanar with a tip of the stop layer pattern and the upper surface of the interlayer insulating film pattern.

20. A method of forming an electronic device, the method comprising:
providing an electrically conductive wiring layer on a substrate;
forming a first insulating layer on the wiring layer and on the substrate wherein a surface of the first insulating layer opposite the substrate is a non-planar surface with raised portions of the first insulating layer on the wiring layer and with depressed portions;
forming a stop layer on the non-planar surface of the first insulating layer with raised portions of the stop layer on raised portions of the first insulating layer and with depressed portions of the stop layer on depressed portions of the first insulating layer, wherein the stop layer and the first insulating layer comprise different materials;
forming a second insulating layer on the stop layer, wherein the stop layer and the second insulating layer comprise different materials;
removing portions of the second insulating layer to expose raised portions of the stop layer while maintaining portions of the second insulating layer on the depressed portions of the stop layer;
removing the raised portions of the stop layer to expose portions of the first insulating layer on the wiring layer while maintaining the depressed portions of the stop layer and portions of the second insulating layer on the depressed portions of the stop layer;
removing portions of the first insulating layer on the wiring layer to form a via hole exposing portions of the wiring layer; and
forming a via contact in the via hole such that an upper surface of the via contact is coplanar with a tip of the depressed portions of the stop layer and an upper surface of the portions of the second insulating layer on the depressed portions of the stop layer.

21. A method according to claim 20, wherein portions of the stop layer overlap portions of the wiring layer that are in a plane parallel to a surface of the substrate, after removing the raised portions of the stop layer.

22. A method according to claim 20, wherein the wiring layer comprises a metal wiring layer, and wherein the contact is
an electrically conductive contact formed in the via hole such that the electrically conductive contact and the wiring layer are in direct electrical contact.

* * * * *